(12) United States Patent
Juhmonji

(10) Patent No.: US 8,441,012 B2
(45) Date of Patent: May 14, 2013

(54) ARRAY SUBSTRATE, METHOD FOR MANUFACTURING ARRAY SUBSTRATE, AND DISPLAY DEVICE

(75) Inventor: Makoto Juhmonji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1 day.

(21) Appl. No.: 13/388,435

(22) PCT Filed: Jun. 8, 2010

(86) PCT No.: PCT/JP2010/059648
§ 371 (c)(1),
(2), (4) Date: Feb. 1, 2012

(87) PCT Pub. No.: WO2011/021425
PCT Pub. Date: Feb. 24, 2011

(65) Prior Publication Data
US 2012/0126236 A1 May 24, 2012

(30) Foreign Application Priority Data
Aug. 20, 2009 (JP) ................ 2009-190990

(51) Int. Cl.
*H01L 29/417* (2006.01)
*H01L 29/786* (2006.01)
*H01L 21/336* (2006.01)
(52) U.S. Cl.
USPC .......... 257/57; 257/66; 257/72; 257/E29.117; 257/E29.273; 257/E21.409; 257/208; 257/210; 438/149

(58) Field of Classification Search ............. 257/57, 257/59, 66, 72, 208, 210, E29.117, E29.273, 257/E21.409; 438/149
See application file for complete search history.

(56) References Cited

U.S. PATENT DOCUMENTS

| 2002/0000557 A1 | 1/2002 | Kido | |
|---|---|---|---|
| 2007/0231975 A1 | 10/2007 | Asou | |
| 2007/0232080 A1 | 10/2007 | Asou | |
| 2009/0085038 A1* | 4/2009 | Tsubata et al. | 257/72 |
| 2009/0236606 A1* | 9/2009 | Sun et al. | 257/72 |
| 2010/0038639 A1* | 2/2010 | Akimoto | 257/43 |
| 2012/0007087 A1* | 1/2012 | Mizoguchi et al. | 257/59 |

FOREIGN PATENT DOCUMENTS

| JP | 2002-83765 A | 3/2002 |
|---|---|---|
| JP | 2002-334830 A | 11/2002 |
| JP | 2007-273826 A | 10/2007 |

(Continued)

*Primary Examiner* — Victor A Mandala
(74) *Attorney, Agent, or Firm* — Chen Yoshimura LLP

(57) ABSTRACT

The present invention provides an array substrate, a method for manufacturing an array substrate, and a display device which are such that reflow failure of a resist mask does not occur readily at the time of manufacture of the array substrate, so the array substrate can be manufactured reliably. At the time of forming a TFT, third wiring 37 between source wiring 13 and the source electrode 22 of the TFT is provided with a narrow portion 38 that is formed with a narrow width by narrowing a midpoint at a portion of the wiring in planar shape, and the resist film on the source electrode 22 and a drain electrode 23 is reflowed so as to cover the surface of a channel region Q, thus forming a reflowed resist film 42. A semiconductor film 20 is etched using this as the etching mask in a state in which the area between the source and the drain is protected, thus making the semiconductor film 20 into an island shape.

14 Claims, 12 Drawing Sheets

FOREIGN PATENT DOCUMENTS

| | | |
|---|---|---|
| JP | 2007-273827 A | 10/2007 |
| JP | 2007-273828 A | 10/2007 |
| JP | 2008-117964 A | 5/2008 |
| JP | 2008-177443 A | 7/2008 |

* cited by examiner (a)

(b)

(c)

(d)

(h)

(i)

(j)

(a)

(b)

(c)

(d)

(a)

(b)

ARRAY SUBSTRATE, METHOD FOR MANUFACTURING ARRAY SUBSTRATE, AND DISPLAY DEVICE

TECHNICAL FIELD

The present invention relates to an array substrate, a method for manufacturing an array substrate, and a display device and particularly to an array substrate that is suitably used in a display device such as a liquid crystal display device and a method for manufacturing same.

BACKGROUND ART

Various types of display device such as liquid crystal display devices and plasma display devices have been utilized in recent years. Many of these display devices include an array substrate on which a plurality of signal lines and a plurality of scan lines are arranged in a matrix, with a pixel electrode being formed for each pixel that constitutes a display unit.

As array substrates, active matrix-type array substrates have been widely used in the past which are configured such that switching elements are provided for respective pixels that serve as display units in the vicinity of the intersecting portions between the aforementioned signal lines and scan lines to drive the respective pixels. Thin-film transistors (TFTs) formed by laminating a semiconductor thin film of amorphous silicon or the like, for example, a gate insulating film, an electrode, and the like are used as switching elements for such array substrates.

In order to form TFTs on an array substrate, a film formation step in which a thin film is formed on the surface of an insulating substrate, a photolithography step in which the surface of the aforementioned thin film is coated with a resist film, and the aforementioned resist film is exposed and developed to form a specified pattern using a photomask, and an etching step in which the aforementioned thin film is etched using the resist film formed in the specified pattern (this may be referred to as a resist mask in some instances) as the protective film to create the specified pattern have been repeated multiple times in the past.

In the case of the manufacture of an array substrate that uses inversely-staggered amorphous silicon TFTs, for example, a so-called five-mask process has been common in the past in which a total of five photomasks, i.e., a mask for the scan lines, a mask for the semiconductor layer (used for channel protection), a mask for the source/drain electrode, a mask for the contact holes (for passivation), and a mask for the pixel electrodes, was normally used, repeating the photolithography step five times for the respective photomasks. When an array substrate is to be manufactured, reducing the mask process in the photolithography steps is an extremely important target in order to reduce the manufacturing cost by effects obtained by reducing the cost of the masks, shortening the manufacturing steps, cutting down the man hours, and the like and to increase the yield.

Various four-mask processes in which an array substrate is manufactured with one photomask being reduced have been proposed in the manufacture of array substrates. As one of four-mask processes, a method for using a so-called reflow process in which one of the photolithography steps is omitted by causing the resist film to swell/be softened in a vapor atmosphere of an organic solvent and changing the shape of the resist film is publicly known (for example, see Patent Document 1). By using the aforementioned reflow process, it is possible to omit the photolithography step that uses a mask for the semiconductor layer (for channel protection).

RELATED ART DOCUMENTS

Patent Documents

Patent Document 1: Japanese Patent Application Laid-Open Publication No. 2002-334830

SUMMARY OF THE INVENTION

Problems to be Solved by the Invention

FIGS. 10(a) to 10(d) are process diagrams showing a prior art reflow process. The reflow process described in the aforementioned Patent Document 1 is such that a gate electrode 122 is first formed on a substrate 121, and a gate insulating film 123, an a-Si layer 124, an n+ a-Si layer 125, and a metal film 126 are sequentially formed and laminated thereon as shown in FIG. 10(a). Then, resist masks 127 and 128 are formed on the metal film 126 using a photolithography technique.

Next, as is shown in FIG. 10(b), an ohmic contact layer 131 for a source electrode, a source electrode 129, an ohmic contact layer 132 for a drain electrode, and a drain electrode 130 are formed by dry etching.

Next, as is shown in FIG. 10(c), the resist masks 127 and 128 are dissolution-reflowed by exposure in the vapor of an organic solvent. The surface areas of the resist masks 127 and 128 expand, and portions in close proximity coalesce, resulting in an integrated dissolution-reflowed resist mask 133.

Next, as is shown in FIG. 10(d), etching that involves subjecting the a-Si layer 124 to a second etching is performed, thus forming an island layer 134. As a result of the aforementioned dissolution-reflowed resist mask 133 being removed (not shown), an inversely-staggered TFT is formed. Thereafter, by forming a pixel electrode, an insulating film, an alignment film, and the like on the TFT, a TFT array substrate is obtained.

FIG. 11 is a plan view of FIG. 10(b). As is shown in FIG. 11, there is a gap between the source 131 and the drain 132 prior to the reflow of the resist masks, so the a-Si layer 124 is exposed. As is shown in FIG. 10(c), in cases where the resist masks 127 and 128 are dissolution-reflowed, the dissolution-reflowed resist mask 133 fills the gap between the source 131 and the drain 132 which are close proximity portions. As a result of the reflowed resist mask 133 securely protecting the portion between the source 131 and the drain 132, the a-Si layer 124 is remained in the step of forming the island layer 134 shown in FIG. 10(d), and this portion is formed as the channel.

FIG. 12(a) is a plan view in a case that the reflow is performed normally, and FIG. 12(b) is a plan view in a case that the reflow results in a failure. As is shown in FIG. 12(a), when reflow is performed normally during dissolution-reflow, the resist mask 133a completely covers the portion between the source electrode 131 and the drain electrode 132. However, a reflow failure may occur during dissolution-reflow. For instance, as is shown in FIG. 12(b), there are cases in which the reflowed resist mask 133b does not flow between the source 131 and the drain 132 and instead ends up flowing toward the source wiring 135. When such reflow failure occurs, a resist mask is not adequately formed between the source 131 and the drain 132. The a-Si layer 124 is not covered by the resist mask 133b and is exposed to the outside. As a result, when etching for forming an island layer 134 is performed in the subsequent step, there is a problem in that the a-Si layer 124 in the channel portion does not remain, so the performance as a TFT cannot be sufficiently exhibited, thus resulting in a defective product.

In light of the aforementioned circumstances, an object of the present invention is to provide an array substrate, a method for manufacturing an array substrate, and a display device which are such that reflow failure of a resist mask does not occur readily at the time of manufacture of the array substrate, so the array substrate can be manufactured reliably.

Means for Solving the Problems

In order to solve such a problem, the gist of the array substrate of the present invention is an array substrate including:

a substrate;

a plurality of first wiring lines provided on the substrate substantially parallel to each other;

a plurality of second wiring lines provided so as to be substantially orthogonal to the plurality of first wiring lines;

an insulating layer interposed at the intersecting portions between the first wiring lines and the second wiring lines;

switching elements respectively electrically connected to the first wiring lines and the second wiring lines and configured by laminating a plurality of thin films; and third wiring lines which are provided so as to be respectively continuous with the first wiring lines or the second wiring lines and which respectively connect the switching elements to the first wiring lines or the second wiring lines, wherein each of the switching elements is made in an island shape by etching that makes use of a reflowed resist film obtained by reflow of a resist film formed on the switching element, the corresponding one of the third wiring lines, and the corresponding one of the first wiring lines and second wiring lines, and each of the third wiring lines is provided with a narrow portion in which the width is narrowed in planar shape.

Furthermore, the present invention provides a method for manufacturing an array substrate that includes:

a substrate;

a plurality of first wiring lines provided on the substrate substantially parallel to each other;

a plurality of second wiring lines provided so as to be substantially orthogonal to the plurality of first wiring lines;

an insulating layer interposed at the intersecting portions between the first wiring lines and the second wiring lines;

a plurality of switching elements respectively electrically connected to the first wiring lines and the second wiring lines and configured by laminating a plurality of thin films; and third wiring lines which are provided so as to be respectively continuous with the first wiring lines or the second wiring lines and which respectively connect the switching elements to the first wiring lines or the second wiring lines, wherein the method includes an etching step in which each of the switching elements is formed into an island shape that is continuous with the corresponding one of the first wiring lines or second wiring lines, the etching step includes: a first etching step in which a resist film in a first pattern having two mutually facing regions is formed on a surface of a first layer to be etched on each of the switching elements, and the first etching is performed to form the first layer into the first pattern and also to expose a second layer to be etched around the first pattern;

a reflow step in which the resist film in the first pattern is reflowed such that the resist film that is reflowed forms a reflowed resist film having an island-shaped second pattern that covers a specified region of the second layer to be etched; and a second etching step in which etching is performed from above the reflowed resist film to form the switching element in the island-shaped pattern by the etching of the second layer to be etched, the reflow step involves reflow of the resist film formed on the switching element, the corresponding one of the third wiring lines, and the corresponding one of the first wiring lines or second wiring lines to form the reflowed resist film, and each of the third wiring lines is provided with a narrow portion in which the width is narrowed in planar shape, and the resist film in the first pattern is reflowed so as to cover the surface of the switching element.

Moreover, a display device of the present invention includes a display panel that uses the aforementioned array substrate as the switching substrate.

Effects of the Invention

In the array substrate of the present invention, each of the switching elements is such that formation of the switching element in an island shape is performed by etching that makes use of a reflowed resist film obtained by reflow of a resist film formed on the switching element, the corresponding one of the third wiring lines, and the corresponding one of the first wiring lines or second wiring lines, and each of the third wiring lines is provided with a narrow portion in which the width is narrowed in planar shape, so when the resist film formed on the switching element is reflowed, it is possible to prevent the reflow of the resist film over the switching element by being dragged by the first wiring line or second wiring line and to reliably form a reflowed resist film on the switching element. As a result, reflow failure can be prevented, so it is possible to form a reliable pattern by a resist mask in the subsequent etching step and to prevent occurrence of defective products.

In the method for manufacturing an array substrate of the present invention, the reflow step involves reflow of the resist film formed on each of the switching elements, the corresponding one of the third wiring lines, and the corresponding one of the first wiring lines or second wiring lines to form a reflowed resist film, and with each of the third wiring lines being provided with a narrow portion in which the width is narrowed in planar shape, the resist film in the first pattern is reflowed so as to cover the surface of each of the switching elements. Therefore, it is possible to reliably form a reflowed resist film in a specified shape by suppressing flow of the reflowed resist film toward the wiring line and performing secure reflow. As a result, the pattern can be formed reliably by etching, so occurrence of defective products can be prevented during manufacture of the array substrates.

BRIEF DESCRIPTION OF THE DRAWINGS

FIG. 12(a) shows a case in which the reflow is normal, and FIG. 12(b) shows a case in which reflow fails.

DETAILED DESCRIPTION OF EMBODIMENTS

Figure 1:
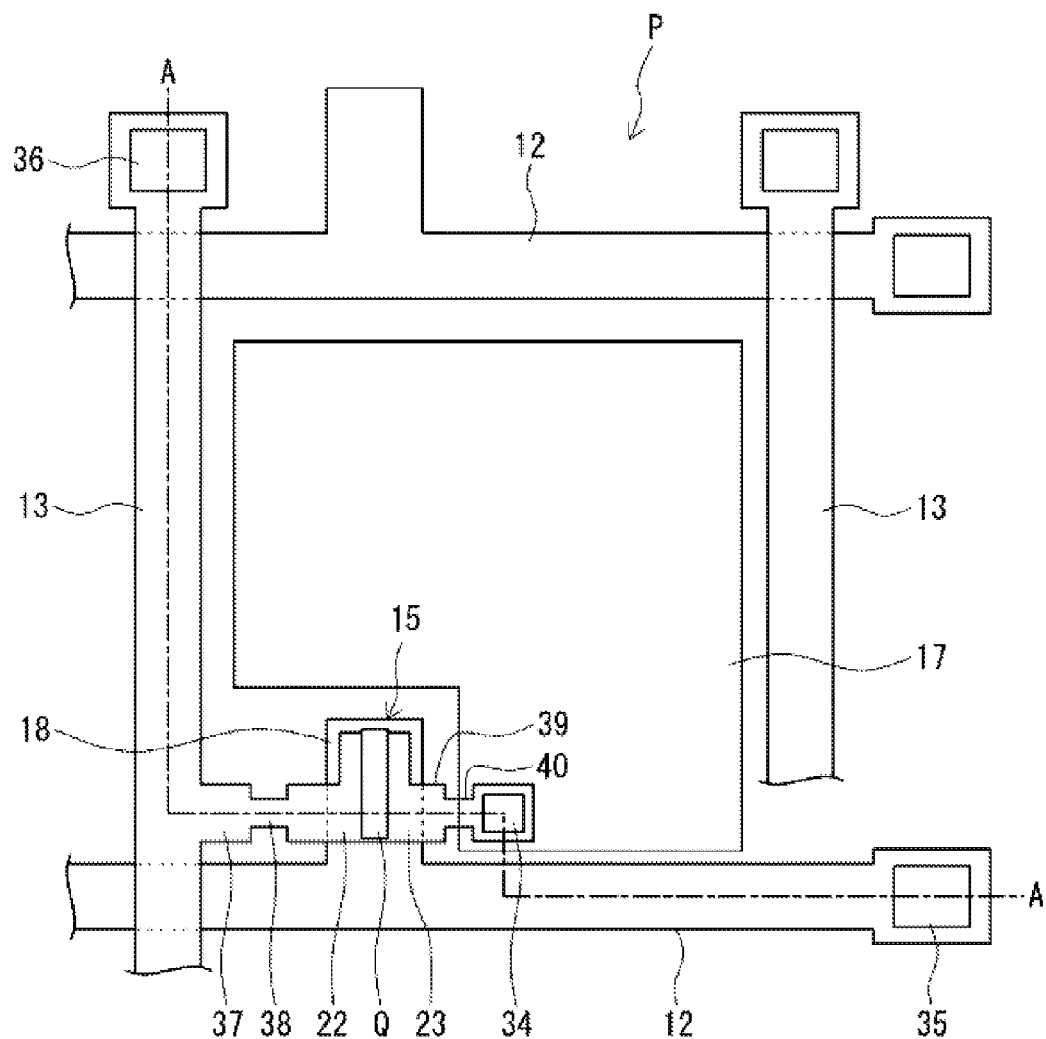
FIG. 1 is a plan view showing a portion of one embodiment of an array substrate of the present invention.
Figure 2:
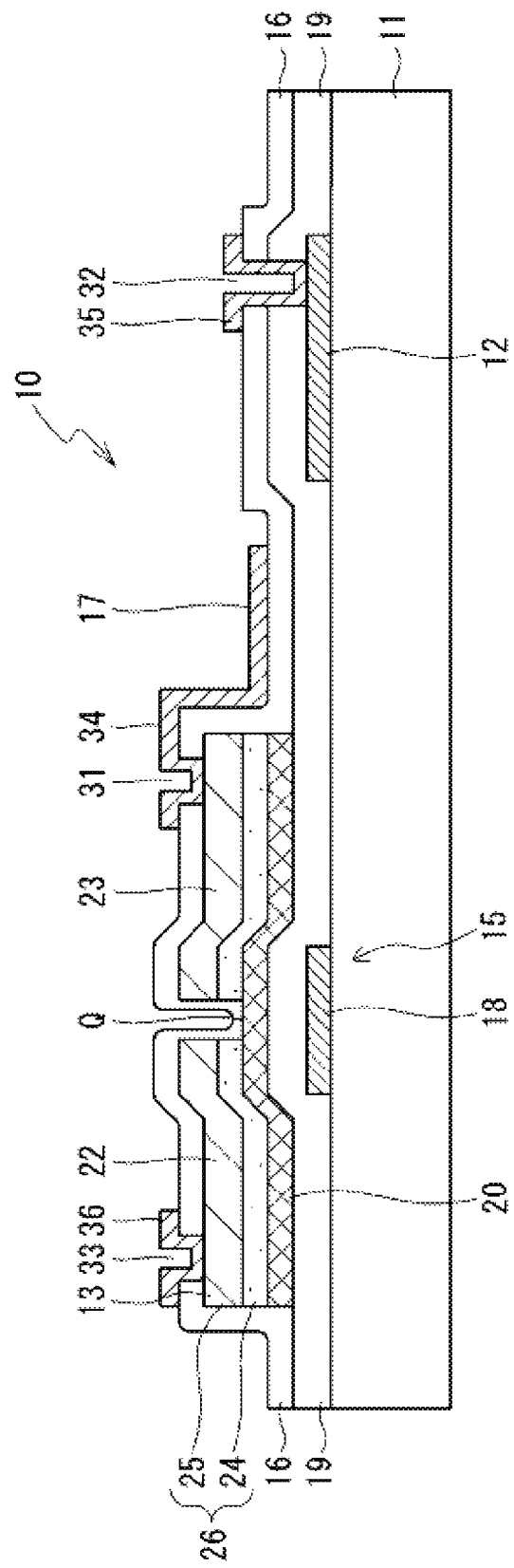
FIG. 2 is a sectional view along line A-A of the array substrate of FIG. 1.

An embodiment of the present invention will be described in detail below with reference to figures. FIG. 1 is a plan view showing a portion of one embodiment of the array substrate of the present invention. FIG. 2 is a sectional view along line A-A of the array substrate of FIG. 1. The embodiment shown in FIG. 1 is an example of an array substrate used in an active matrix-type liquid crystal display device in which thin film transistors (TFTs) are used as switching elements. The array substrate is provided with a plurality of pixels P in a matrix on the surface of the substrate, but only a portion of a single pixel P is shown in FIGS. 1 and 2.

As is shown in FIGS. 1 and 2, in the array substrate 10, gate wiring lines (scan lines) 12 are provided as first wiring in the left-and-right horizontal direction in FIG. 1 on the surface of an insulating transparent substrate 11 composed of a glass plate or the like as the substrate. The plurality of gate wiring lines 12, 12, . . . are provided substantially parallel to each other with a specified interval in the up-and-down direction in FIG. 1. Furthermore, a plurality of source wiring lines (may also be referred to as signal lines or data lines) 13 are provided on the array substrate 10 as second wiring in the up-and-down direction in FIG. 1 so as to be substantially orthogonal to the aforementioned gate wiring lines 12. The plurality of source wiring lines 13, 13 . . . are provided substantially parallel to each other with a specified interval in the left-and-right direction in FIG. 1. In the intersecting portions between the gate wiring lines 12 and the source wiring lines 13, a gate insulating film (insulating layer) 19 that insulates between the two layers is interposed, thus insulating the two.

A thin-film transistor (TFT) 15 which is formed by laminating a plurality of thin films as a switching element for switching each pixel P on and off is electrically connected to a gate wiring line 12 and a source wiring line 13. Each TFT 15 is provided in the vicinity of the intersecting portion between a gate wiring line 12 and a source wiring line 13. An interlayer insulating film 16 is provided on the surface of the TFT 15, and a pixel electrode 17 composed of a transparent conductive film of indium tin oxide (ITO) or the like is further provided on the surface of the interlayer insulating film 16.

The TFT 15 includes a gate electrode 18 that is formed so as to be connected to the gate wiring line 12 on the surface of the transparent substrate 11, the gate insulating film 19 that is formed on this gate electrode 18, a semiconductor film 20 that is formed on this gate insulating film 19 and that includes a channel region Q, a source electrode 22 that is connected to one end of the semiconductor film 20, and a drain electrode 23 that is connected to the other end of the semiconductor film 20 and that is connected to the source electrode 22 via the channel region Q. The source wiring line 13 for supplying image signals is connected to the source electrode 22.

The interlayer insulating film 16 is provided on the source electrode 22 and drain electrode 23. Contact holes 31, 32, and 33 are provided in the interlayer insulating film 16. The pixel electrode 17 composed of a transparent conductive film is provided in a specified pattern in a specified position on the interlayer insulating film 16. Moreover, a transparent conductive film is formed in the portions of the contact holes 31, 32, and 33, thus providing terminal portions 34, 35, and 36.

Glass, plastic, or the like having a thickness of 0.5 mm, 0.7 mm, 1.1 mm, or the like can be used for the transparent substrate 11.

The gate wiring lines 12 as the first wiring and the gate electrode 18 are formed from a metal film with a thickness of 1000 Å to 3000 Å. For the metal film, for example, a metal film of titanium (Ti), chromium (Cr), aluminum (Al), molybdenum (Mo), tantalum (Ta), tungsten (W), copper (Cu), or the like, an alloy film of molybdenum tantalum (MoTa), molybdenum tungsten (MoW), or the like, or laminated films of these can be used.

The gate insulating film 19 is formed from a film of silicon oxide ($SiO_x$), silicon nitride ($SiN_x$), or the like. The semiconductor film 20 is formed from an amorphous silicon (a-Si) film, for instance. A doped semiconductor film 24 is formed from a film of amorphous silicon doped with n-type impurity such as phosphorus (P) at a high concentration ($n^+$ a-Si). A second conductive film 25 is ordinarily formed using a sputtering method from a single metal film of aluminum (Al), chromium (Cr), tantalum (Ta), titanium (Ti), or the like, or a laminated film with a metal nitride of these.

The source electrode 22, the drain electrode 23, and the source wiring line 13 connected to the source electrode 22 are configured of a laminated body 26 in which the doped semiconductor film 24 and the second conductive film 25 are laminated.

For the interlayer insulating film 16, an inorganic insulating film or the like such as silicon nitride film ($SiN_x$), for example, can be used. The silicon nitride film is formed so as to conform to the shape of the TFT. Although this is not specifically shown in the figures, the interlayer insulating film 16 may also have a planarization film (organic insulating film) composed of acrylic resin formed on the surface of the inorganic insulating film. For example, the inorganic insulating film can be formed to a thickness of approximately 0.2 to 0.3 μm, and the planarization film can be formed to a thickness of approximately 1.8 to 2.2 μm.

For the transparent conductive film used for the pixel electrode 17, terminal portions 34, 35, and 36, and the like, a transparent conductive material, such as indium-zinc oxide (IZO), zinc oxide, or tin oxide, can be used besides ITO. The transparent conductive film can be formed to a thickness of 1000 Å to 2000 Å by a sputtering method or the like.

The pixel electrode 17 is connected to the drain electrode 23 of the TFT 15 via the terminal portion 34.

The source wiring line 13 for supplying image signals is connected to the source electrode 22 of the TFT. The source wiring line 13 is connected, with the contact hole 33 having the transparent conductive film formed thereon as the terminal portion 36, to a wiring line that is linked to a source signal supply circuit (not shown) for supplying image signals.

The gate wiring line 12 for sequentially applying scan signals at a specified timing is connected to the gate electrode 18 of the TFT 15. The gate wring line 12 is connected, with the contact hole 32 having the transparent conductive film formed thereon as the terminal portion 35, to a wiring line that is linked to a scan signal supply circuit (not shown). As a result of the gate wiring line 12 supplying a scan signal to the gate electrode 18 to place the TFT 15 in an ON state only for a certain period of time, an image signal supplied from the source wiring line 13 is written into each pixel P at a specified timing.

Figure 3:
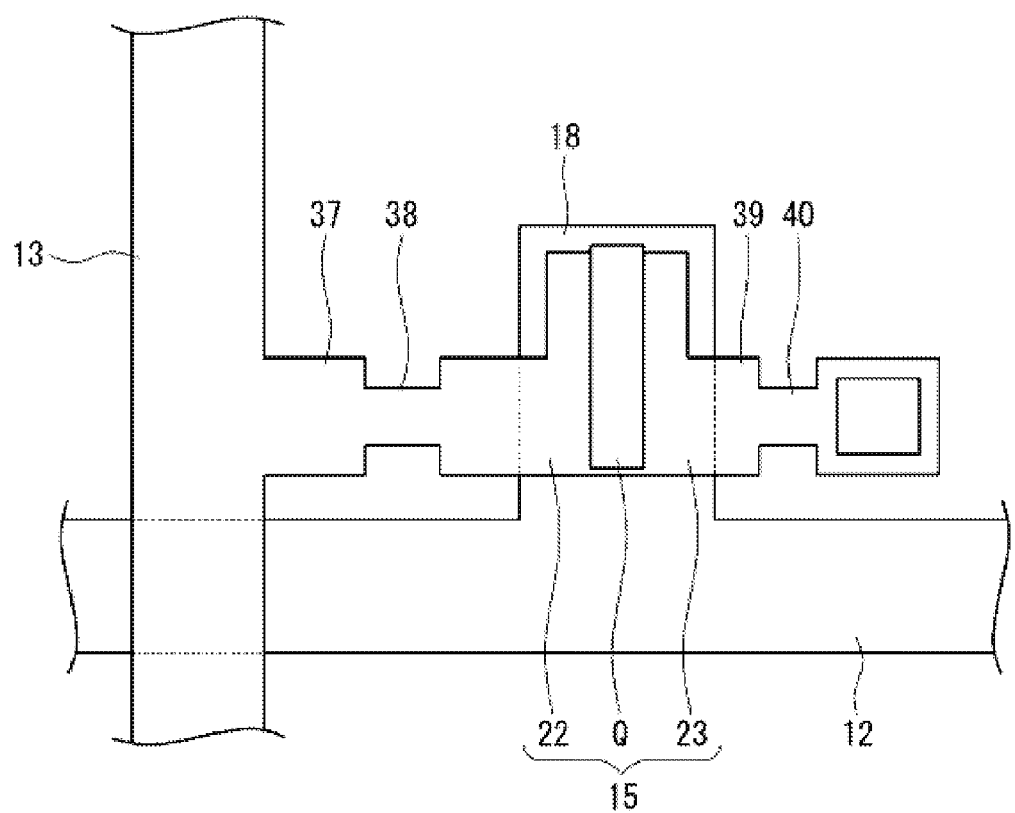
FIG. 3 is an enlarged diagram of the TFT portion of FIG. 1.

The source electrode 22 of the TFT 15 and the source wiring line 13 are connected by a third wiring line 37 that is provided in a continuous manner with the aforementioned source wiring line 13. FIG. 3 is an enlarged view of the TFT portion of FIG. 1. As is shown in FIGS. 1 and 3, the third wiring line 37 is provided with a narrow portion 38 whose planar shape is formed with a narrow width by narrowing a midpoint at a portion of the wiring line.

A significant characteristic feature of the present invention lies in that this third wiring line 37 is provided with the narrow portion 38. By providing the narrow portion 38, though a detail will be described later, the resist film is prevented from being dragged toward the source wiring line 13 in the reflow step during manufacture of the TFT 15. Then, the resist film on the source electrode and the drain electrode reliably flows into the channel portion Q of the TFT 15 into which reflow is originally required. As a result, the channel portion can be completely protected by the resist film at the time of etching of the semiconductor film 20.

In addition, as is shown in FIGS. 1 and 3, the drain electrode 23 of the TFT 15 and the terminal portion 34 connected to the pixel electrode 17 are connected by a fourth wiring line 39. Then, as in the third wiring line 37, the fourth wiring line 39 is provided with a narrow portion 40 that is formed with a narrow width by narrowing a midpoint at a portion of the wiring line.

The TFT 15 is such that the laminated body of the semiconductor film 20, doped semiconductor film 24, and second conductive film 25 is etched to form an electrode layer, after which for the purpose of protection of the channel portion, the resist film formed during the formation of the electrode layer is reflowed to form a reflowed resist film for channel etching, and etching is performed in a state in which the channel portion is protected, thus making the semiconductor film 20 into an island shape. The TFT is formed by etching such that the semiconductor film, the doped semiconductor film, and the source and drain electrode portions are in an island shape continuous with the source wiring line.

Figure 4:
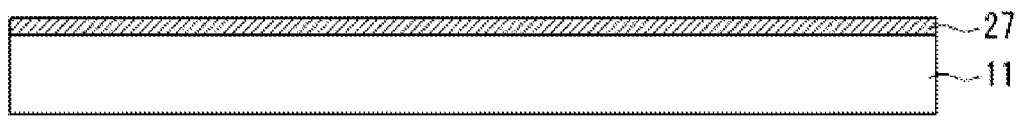
FIGS. 4(*a*) to 4(*d*) are sectional views of principal parts showing a portion of process of forming a TFT of the array substrate.
Figure 4:
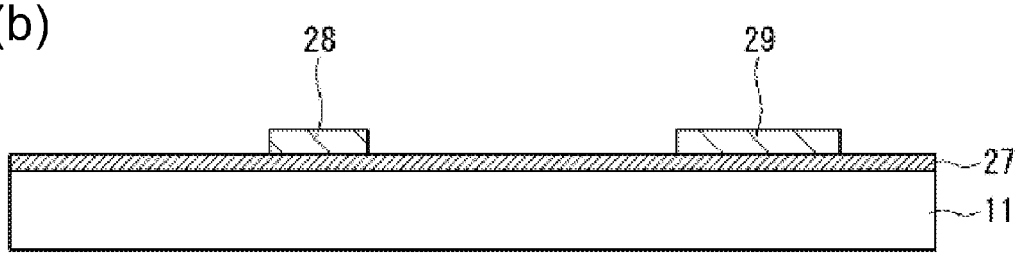
Figure 4:
Figure 4:
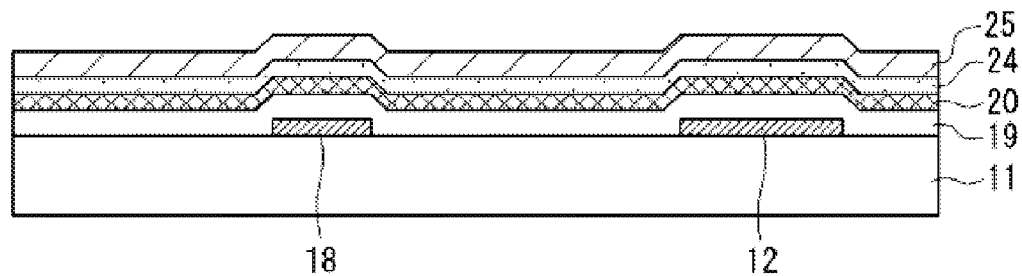

A method for manufacturing an array substrate will be described below. FIGS. 4(*a*) to 4(*d*), FIGS. 5(*e*) to 5(*g*), and FIGS. 6(*h*) to 6(*j*) are sectional views of principal parts showing the steps of forming a TFT of the array substrate. First, as is shown in FIG. 4(*a*), a first conductive film 27 is formed on one surface of a transparent substrate 11 having insulating properties over the entire surface thereof by a sputtering method to a thickness of 1000 Å to 3000 Å.

Next, as is shown in FIG. 4(*b*), the surface of the first conductive film 27 is coated with a photoresist, which is exposed and developed using a first photomask to form resist films 28 and 29 in specified patterns. The patterns of the resist films 28 and 29 are formed to be the patterns of the gate electrode 18 and gate wiring line 12. For the resist material used in the formation of the resist films 28 and 29, either a negative-type or positive-type photosensitive resist material may be used.

Next, as is shown in FIG. 4(*c*), a region of the first conductive film 27 that is not covered by the resist films 28 and 29 is removed by dry etching or wet etching to form a gate electrode 18, a gate wiring line 12, and the like. Then, the resist films 28 and 29 are removed by plasma ashing using oxygen.

Next, as is shown in FIG. 4(*d*), a gate insulating film 19, a semiconductor film 20, a doped semiconductor film 24, and a second conductive film 25 are successively formed on the gate electrode 18 and gate wiring line 12. Three layers of films of the gate insulating film 19, semiconductor film 20, and doped semiconductor film 24 are consecutively formed in the same apparatus using a plasma CVD method.

Next, a first etching step is performed. In the first etching step, a resist film 41 in a first pattern having two regions (the source electrode and the drain electrode) that face each other with a channel region Q in between is formed on the surface of the second conductive film 25, with the second conductive film 25 and doped semiconductor layer 24 of the TFT 15 as the first layers to be etched. Then, the first etching is performed to form the first layers to be etched into the first pattern and also to expose the semiconductor film 20 around the first pattern as a second etching layer. The first etching step will be described below.

Figure 5:
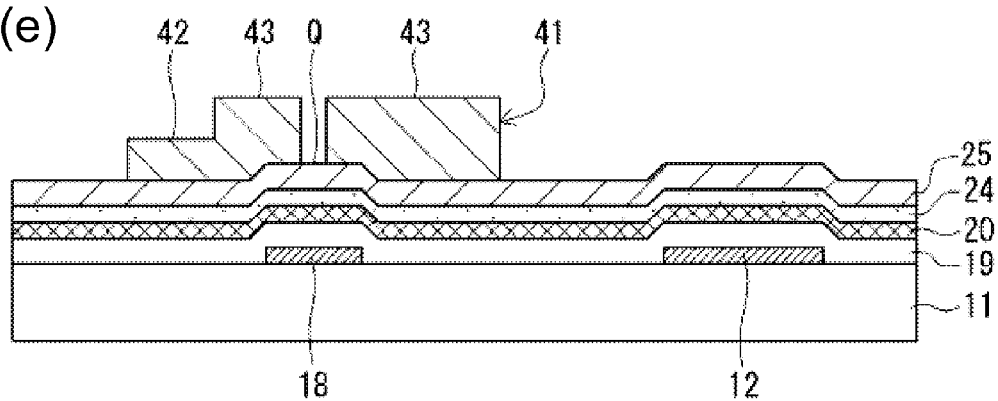
FIGS. 5(e) to 5(g) are sectional views of principal parts showing a portion of process of forming a TFT of the array substrate.
Figure 5:
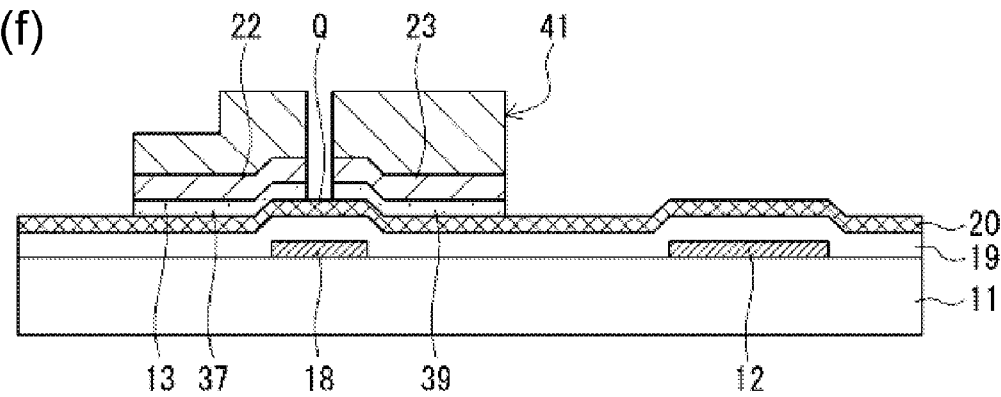
Figure 5:
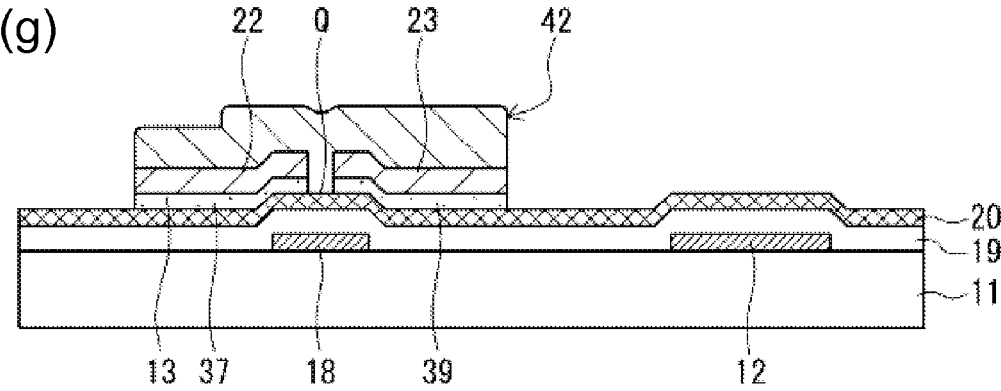
Figure 6:
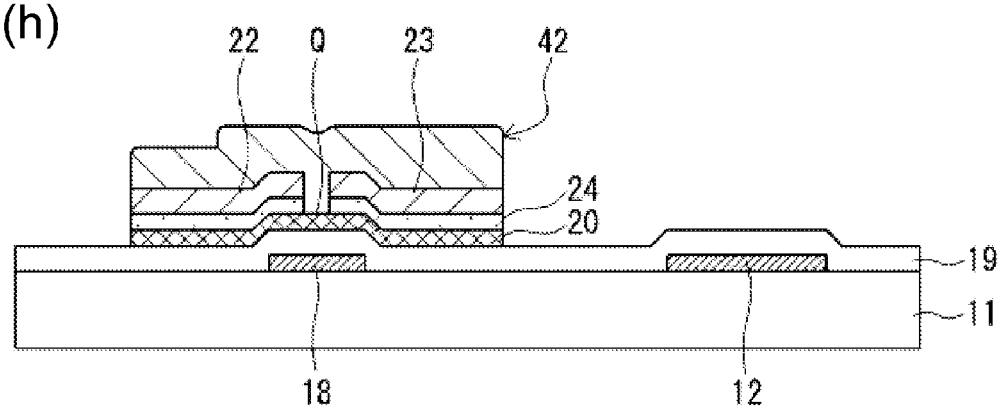
FIGS. 6(h) to 6(j) are sectional views of principal parts showing a portion of process of forming a TFT of the array substrate.
Figure 6:
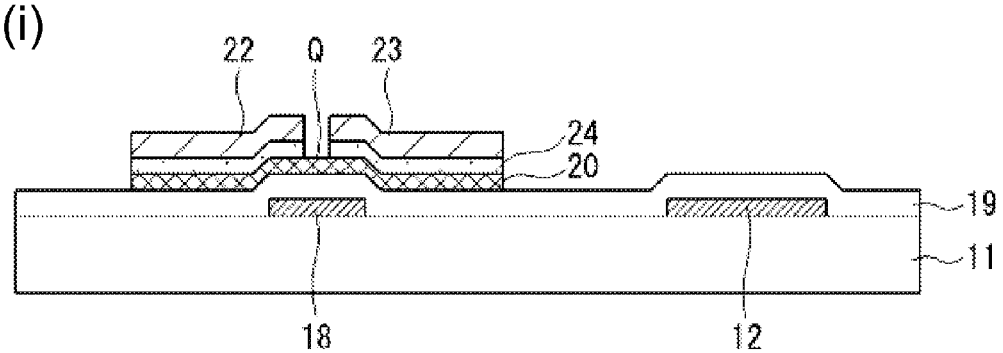
Figure 6:
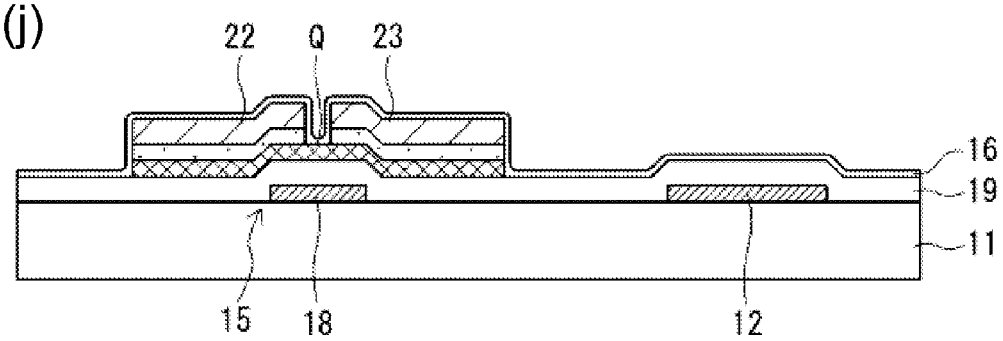

In the first etching step, as is shown in FIG. 5(*e*), the surface of the second conductive film 25 is first coated with a photoresist, which is exposed and developed using a second photomask (not shown) to form a resist film 41 in a pattern (first pattern) of the active region of the TFT 15, the channel region Q of the TFT 15, and a region which will become the source electrode 22, source wiring line 13, and drain electrode 23. The resist film 41 in the first pattern is formed with the planar shape of the portion of the TFT 15 as two islands with a gap between the portions of the source electrode and drain electrode.

The resist film 41 is formed using a multi-tone mask such as a half-tone mask or gray-tone mask as the second photomask, with the portion above the channel region Q of the TFT 15 being an unformed portion, the portion on the source wiring line 13 being formed as a thin-film portion 42 which has a smaller film thickness than the portion on the active region and a region which will become the source electrode 22, source wiring line 13, and drain electrode 23 of the TFT, and the portion other than this being formed as a thick-film portion 43.

Either a negative-type or positive-type photosensitive resist material may be used for the resist material used for forming the resist film 41. In contrast to a binary mask in which a pattern is configured with two tones of a light-shielding portion (black) that shields light and a light-transmissive portion (white) that transmits light, a multi-tone photomask (may also be referred to simply as multi-tone mask) is configured as a photomask of three or more tones composed of a semi-light-transmissive portion (gray) that semi-transmits light in addition to the light-shielding portion (black) and the light-transmissive portion (white). Multi-tone photomasks include gray-tone masks and half-tone masks. A half-tone mask configures a semi-light-transmissive portion by forming the light-shielding film of the semi-light-transmissive portion by means of etching or the like with a smaller thickness than the thickness of the light-shielding portion so as to reduce the amount of transmitted light. A gray-tone mask makes use of a light diffraction effect by providing as the semi-light-transmissive portion a fine pattern with a resolution equal to or lower than the resolution limit of the exposure apparatus. In the case of using a multi-tone photomask, compared to the case of using a binary mask, a resist pattern having a difference in film thickness can be formed by performing exposure and development one time. If a resist film having a plurality of thicknesses is formed by using a multi-tone mask, the number of photomasks in the subsequent steps can be reduced, so the photolithography process can be shortened.

The formation of the resist film 41 is not limited to a method that uses a multi-tone photomask, and any method may be used as long as the method is capable of forming a difference in film thickness. For example, the resist film 41 having a difference in film thickness may also be formed by a method that uses a binary mask instead of using a multi-tone photomask. For instance, the resist film 41 may also be formed using a method which uses a plurality of binary masks, which partially changes the amount of light exposure during exposure, which performs exposure a plurality of times, or the like.

Next, as is shown in FIG. 5(f), dry etching or wet etching is performed on the second conductive film 25 and doped semiconductor film 24. As a result of the etching, the second conductive film 25 and doped semiconductor film 24 in a region not covered by the resist 41 are removed. The active region of the thin-film transistor, source wiring line 13, source electrode 22, drain electrode 23, third wiring line 37, and fourth wiring line 39 are formed.

Next, a second etching step is performed. The second etching step includes a reflow step in which the resist film 41 is reflowed to form a reflowed resist film 42 and an etching step in which etching is performed to make a layer to be etched into an island shape. In the aforementioned reflow step, the resist film 41 in the first pattern is reflowed such that the resist film that is reflowed forms a reflowed resist film 42 having an island-shaped second pattern that covers a specified region (channel region Q) of the semiconductor film 20 which constitutes a second layer to be etched. This reflow step will be described below.

In the reflow step, the resist film 41 in the first resist pattern shown in FIG. 5(f) is modified in shape by chemical reflow, thus forming a reflowed resist film 42 as shown in FIG. 5(g). Chemical reflow is performed by exposing in a gasified solvent atmosphere the substrate to be treated (transparent substrate 11) over which the resist film 41 is formed, thus causing the solvent to permeate into the resist film 41. As a result of the permeation of the solvent, the resist film 41 is softened, thus enhancing the fluidity. As the fluidity increases, the resist film 41 present on the source electrode 22 and drain electrode 23 moves to the area between the source electrode 22 and the drain electrode 23. The resist film 41 spreads so as to fill between the source electrode 22 and the drain electrode 23, so the channel region Q of the semiconductor film 20 is covered by the reflowed resist film 42. Afterward, when the substrate to be treated is removed from the solvent atmosphere, the solvent within the reflowed resist film 42 is volatilized, which results in the loss of fluidity to place the reflowed resist film in a solidified state, so the shape modified by the reflow is maintained. The reflowed resist film 42 is formed with the planar shape of the portion of the TFT 15 as a single island with the area between the source electrode and the drain electrode being filled.

As is shown in FIG. 3, a narrow portion 38 is provided in the third wiring line 37. When the resist film 41 is chemically reflowed with this narrow portion 38 being provided, the flow of the resist film 41 on the source electrode 22 toward the source wiring line 13 is suppressed, so this resist film 41 can be caused to flow so as to cover the surface of the channel region Q. The reason that the flow of the resist film 41 toward the source wiring line 13 can be suppressed by the narrow portion 38 will be described below.

In the case of a conventional TFT, the third wiring line 37 is not provided with a narrow portion, and the entire wiring line is formed with the same width. When the resist film 41 is chemically reflowed in this state, there are cases in which the resist film 41 present on the source electrode 23 does not flow toward the channel region Q, which often makes it impossible to form a good reflowed resist film. The investigation of the cause thereof by the present inventor revealed that this is because when the resist film 41 flows, the flow occurs with a certain degree of viscosity, so the resist film 41 present on the source electrode 22 ends up being dragged in the direction of the source wring line 13 by interfacial tension. It is presumed that such a phenomenon occurs because the resist film 41 has a large difference in surface area between the portion of the resist film on the source wiring line 13 and the resist film on the source electrode 22. In light of this, the present inventor investigated the planar shape of the third wiring line 37 that links between the source wiring line 13 and the source electrode 22 and discovered that by providing a narrow portion with a midpoint of the wiring portion being narrowed to have a small width as shown in FIG. 3, the resist film on the source electrode 22 can be prevented from being dragged by the resist film on the source wiring line 13, thus making it possible to cause the resist film 41 to reliably flow toward the channel region Q.

Furthermore, for the same reason, by providing a narrow portion 40 in the fourth wiring line 39, the resist film 41 on the drain electrode 23 can also be caused to flow reliably toward the channel region Q. Thus, because both the third wiring line 37 and the fourth wiring line 39 are respectively provided with the narrow portions 38 and 40, when the resist film 41 on the source electrode 22 and drain electrode 23 is chemically reflowed, the flow can be caused to occur reliably toward the channel region Q that is positioned in the interspace between the two electrodes, which makes it possible to form a good reflowed resist film 42.

Moreover, the resist film 41 is formed with the portion on the source wiring line 13 as a thin-film portion 44 and the portion on the source electrode 22 as a thick-film portion 43. The resist film 41 is formed such that the thickness of the resist film on the source wiring line 13 is smaller than that of the resist film 41 on the source electrode 22 and drain electrode 23. For this reason, it is possible to further reduce the dragging of the resist film 41 on the source electrode 22 toward the source wiring line 13. When the resist film 41 is reflowed, the reflowed resist film 42 can reliably cover the channel region Q.

With regard to the chemical reflow apparatus, conditions, and the like in the reflow step, it is possible to employ a publicly known means such as the one described in Japanese Patent Application Laid-Open Publication No. 2002-334830. For example, $N_2$ gas may be supplied to the solvent atmosphere at the time of the chemical reflow. In addition, the temperature of the solvent atmosphere may be adjusted to a specified temperature. Chemical reflow was employed as the reflow method in the present embodiment, but the reflow method of the present invention is not limited to chemical reflow. For instance, thermal reflow, combined use of chemical reflow and thermal reflow, or the like can be used as the reflow method. Chemical reflow has an advantage over thermal reflow in that it is easy to control the deformation of the resist film due to reflow by avoiding an extreme change in fluidity of the resist film at the time of the reflow.

Next, the second etching step is performed. In the second etching step, as shown in FIG. 6(h), the semiconductor film 20 is etched using the reflowed resist film 42 as the etching mask in a state in which the area between the source and drain is protected. As a result of this etching, the semiconductor film 20 (including the doped semiconductor film 24, source electrode 22, and drain electrode 23 in the upper layers thereof) that is continuous with the source wiring line via the third wiring line is made into the shape of an island.

Next, the reflowed resist film 42 is stripped off by means of ashing or the like as shown in FIG. 6(i). A TFT 15 is formed on the transparent substrate 11.

Next, as is shown in FIG. 6(j), an interlayer insulating film 16 is formed from above the TFT 15 on the surface of the transparent substrate 11 over the entire surface thereof. The interlayer insulating film 16 can be formed by a CVD method or the like in the case of a silicon nitride ($SiN_x$) or other such inorganic insulating film. Furthermore, in the case of an acrylic resin or other such organic insulating film, the formation is possible by applying and drying the composition.

Next, although this is not specifically shown in the figures, a photoresist is applied to the surface of the interlayer insulating film 16 and is exposed and developed using a third photomask, and a resist film in a pattern corresponding to the pattern of contact holes 31, 32, and 33 or the like is formed in a specified position by a photolithography method. Dry etching is performed to form contact holes 31, 32, and 33 or the like in the interlayer insulating film 16. Afterward, the resist film is stripped off by means of ashing.

Next, a transparent conductive film of ITO or the like is formed in a specified pattern on the interlayer insulating film having the contact holes formed therein, thereby the array substrate 10 shown in FIGS. 1 and 2 is obtained. The transparent conductive film is patterned into the shapes of the pixel electrode 17, terminal portions 34, 35, and 36, and the like. A publicly known means can be used for this patterning. A method that can be cited as one example of the patterning is such that a transparent conductive film is formed on the entire surface by a sputtering method or the like, after which exposure and development are performed using a fourth photomask to form a resist pattern, and etching is performed to form the transparent conductive film in the specified patterns of the pixel electrode 17 and terminal portions 34, 35, and 36.

As indicated in the aforementioned array substrate manufacturing method, the array substrate of the aforementioned embodiment can be formed by a four-mask process in which four photomasks are used.

The array substrate of the aforementioned embodiment was described, with the first wiring being the gate wiring lines (scan lines) 12, the second wiring being the source wiring lines (signal lines) 13, and the third wiring being the wiring lines between the source wiring lines (signal lines) 13 and the source electrodes 22, but in the present invention, the first wiring, second wiring, third wiring, and the like are not limited to this. Furthermore, in the aforementioned embodiment, a TFT including a gate electrode, a semiconductor layer, a doped semiconductor layer, and source and drain electrodes was described as an example of a switching element, but the switching element is not limited to a TFT.

Figure 7:
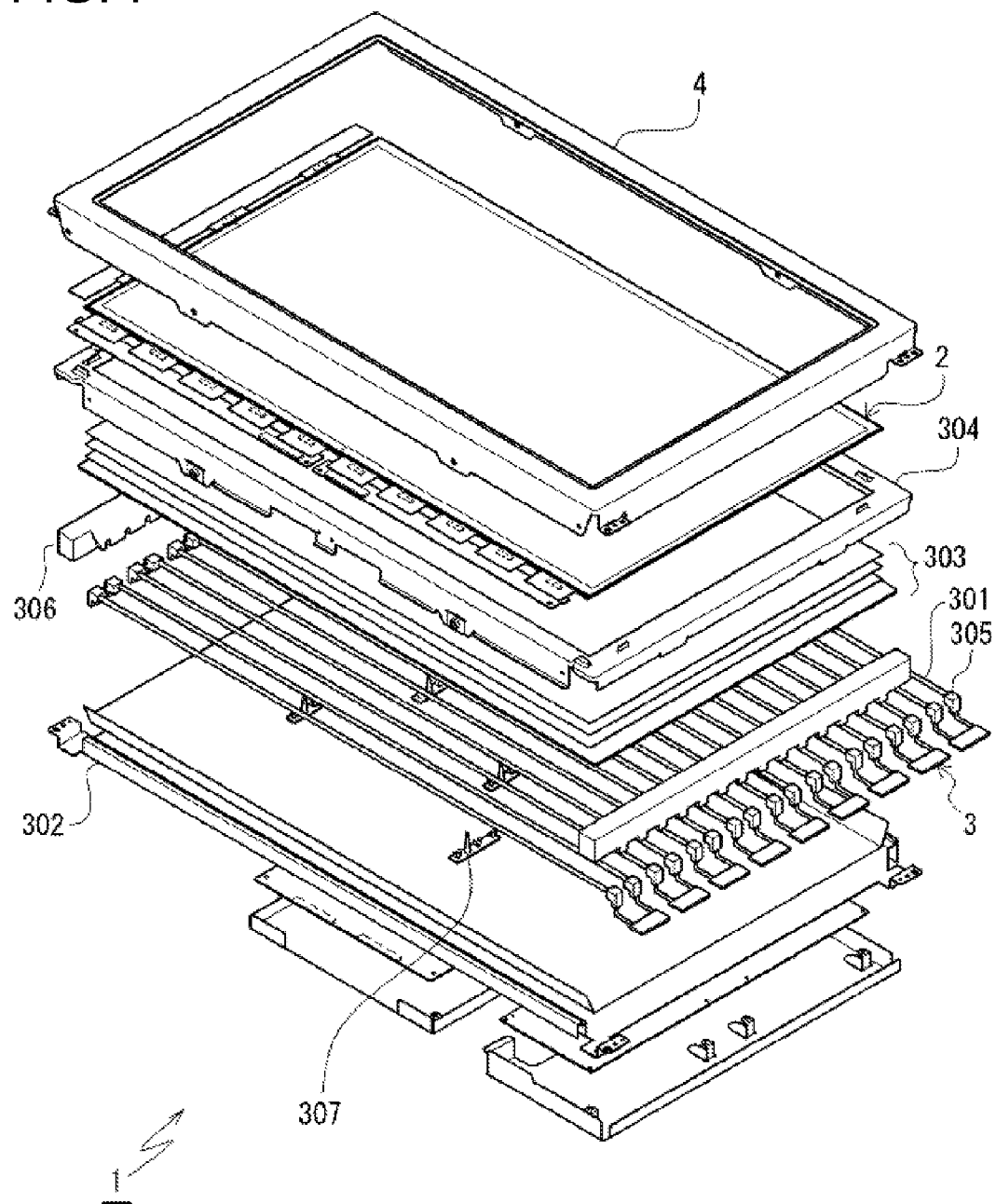
FIG. 7 is a perspective view showing a schematic configuration of a liquid crystal display device constituting one example of the display device of the present invention.
Figure 8:
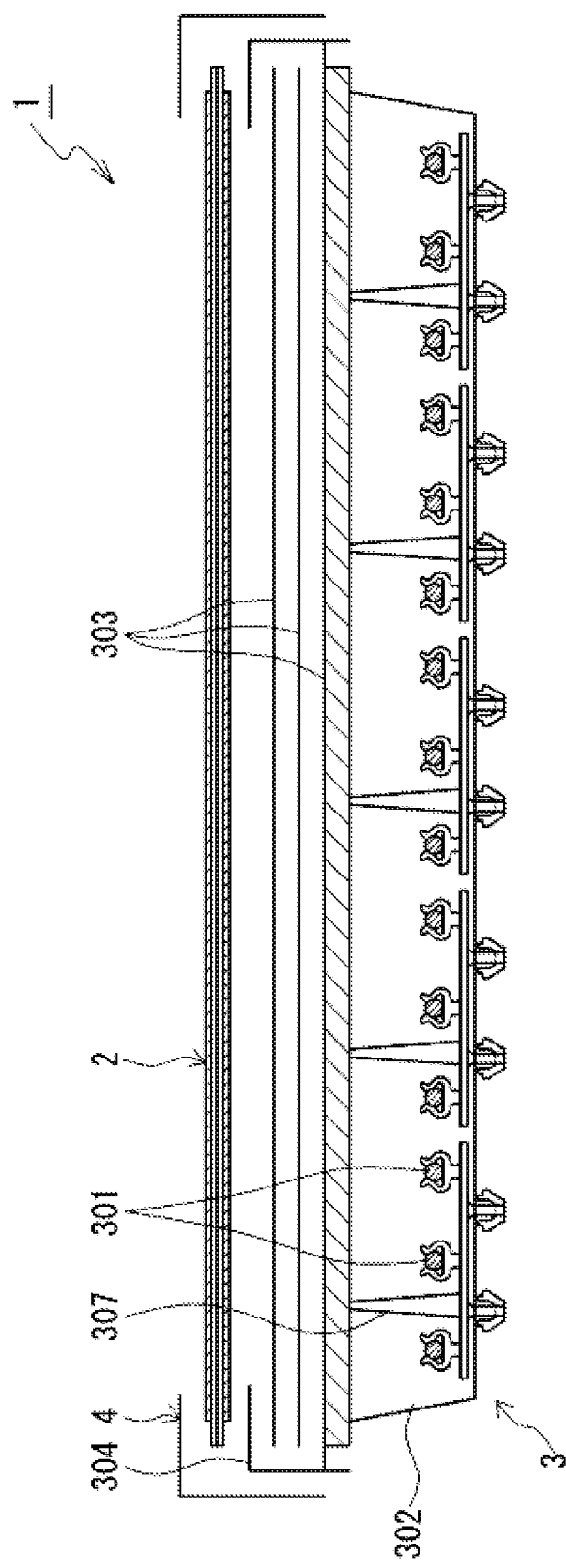
FIG. 8 is a sectional view showing a schematic configuration of the liquid crystal display device of FIG. 7.

The display device of the present invention is a device that is equipped with the aforementioned array substrate. The display device of the present invention will be described below. FIG. 7 is a perspective view showing a schematic configuration of a liquid crystal display device constituting one example of the display device of the present invention. FIG. 8 is a sectional view showing a schematic configuration of the liquid crystal display device of FIG. 7. As is shown in FIGS. 7 and 8, the liquid crystal display device 1 includes a liquid crystal display panel 2 having a rectangular shape and a backlight device 3 constituting the external light source and is formed such that these are held as an integral unit by a bezel 4 or the like.

The backlight device 3 shown in FIGS. 7 and 8 is a so-called direct-type backlight device, and a plurality of cold cathode tubes 301 are disposed as the light source directly underneath the back surface of the panel surface (display surface) of the liquid crystal display panel 2 along this panel surface. The backlight device 3 includes a rectangular base 302 made of metal having a substantially box shape with the upper surface side being open, optical members 303 that are attached so as to cover the opening portion of this base 302, a frame 304 for holding these optical members 303 in the base 302, the cold cathode tubes 301 housed inside the base 302, holders 305 that hold both ends of these cold cathode tubes, lamp holders 306 and clips 307 that collectively cover these, and the like. For the aforementioned optical members 303, a diffusion plate, a diffusion sheet, a lens sheet, and the like are laminated.

Figure 9:
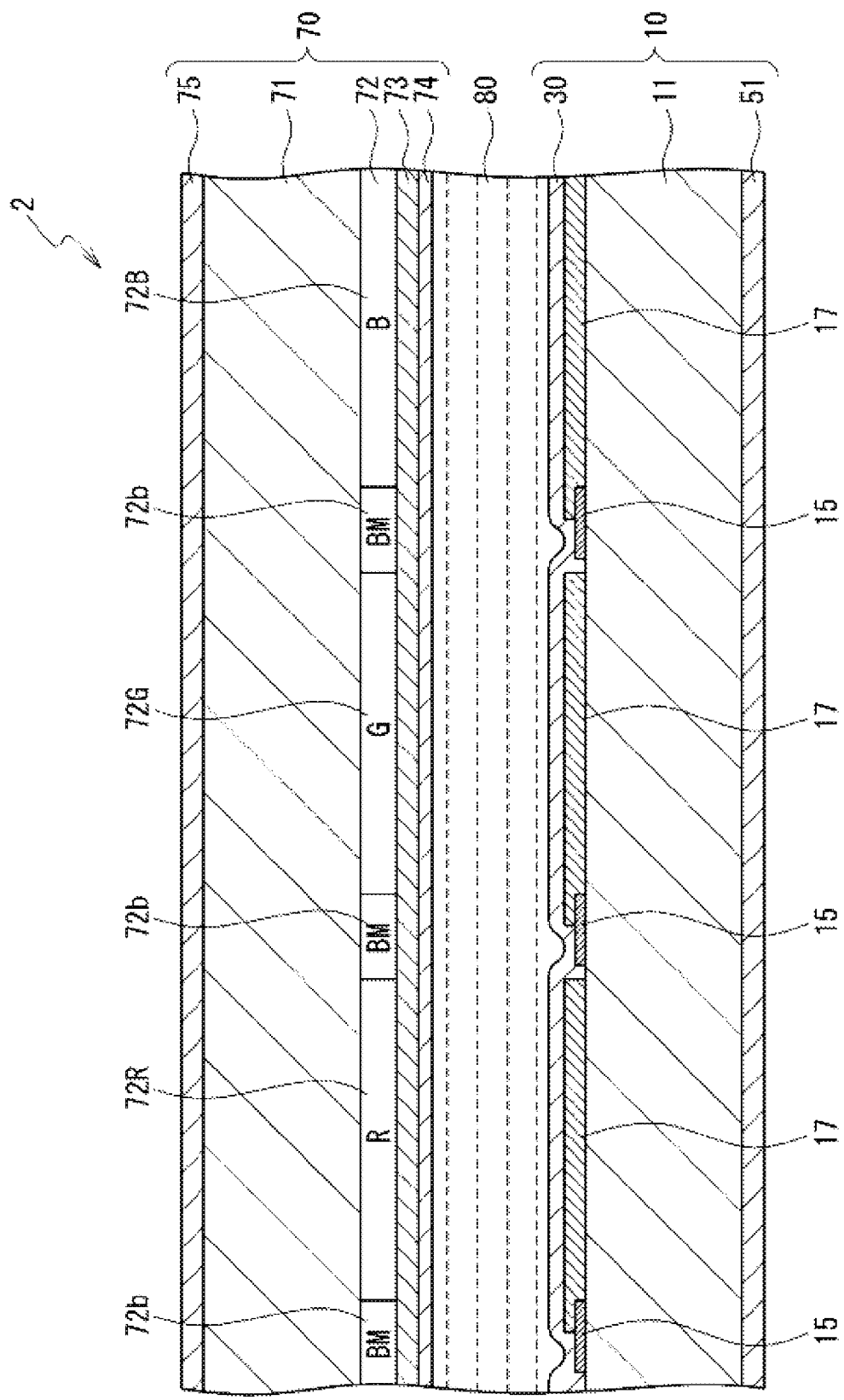
FIG. 9 is a sectional view showing a portion of the liquid crystal display panel of the liquid crystal display device of FIG. 7.
Figure 10:
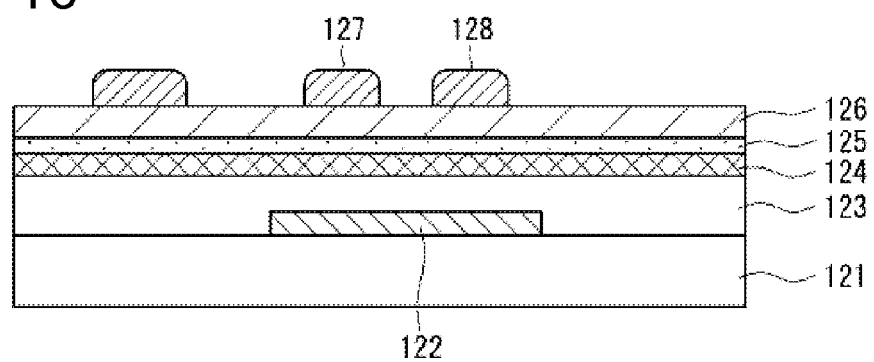
FIGS. 10(a) to 10(d) are process diagrams showing a prior art reflow process.
Figure 10:
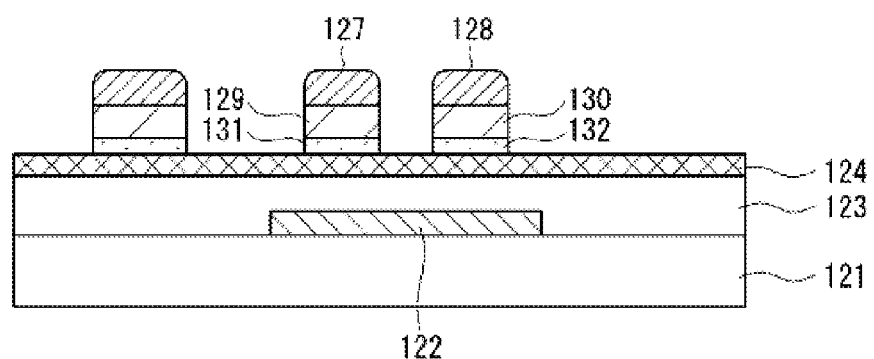
Figure 10:
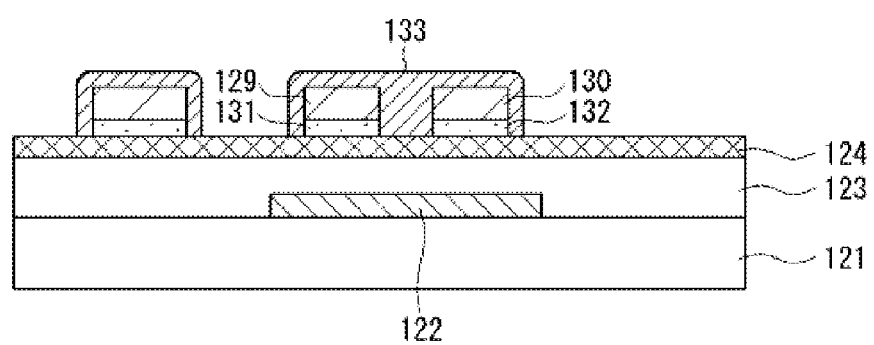
Figure 10:
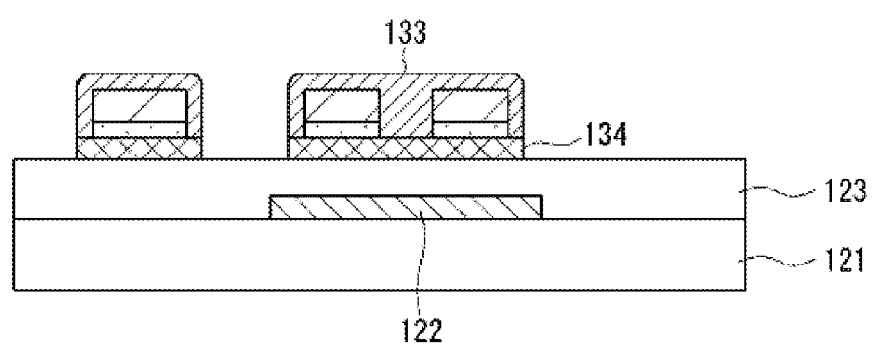
Figure 11:
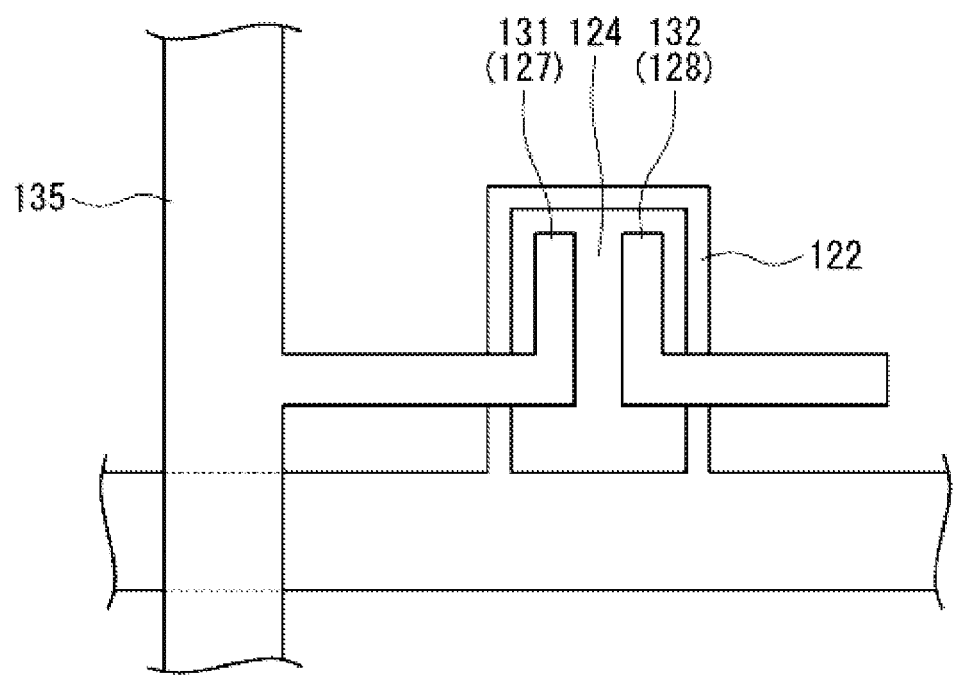
FIG. 11 is a plan view of FIG. 10(b).
Figure 12:
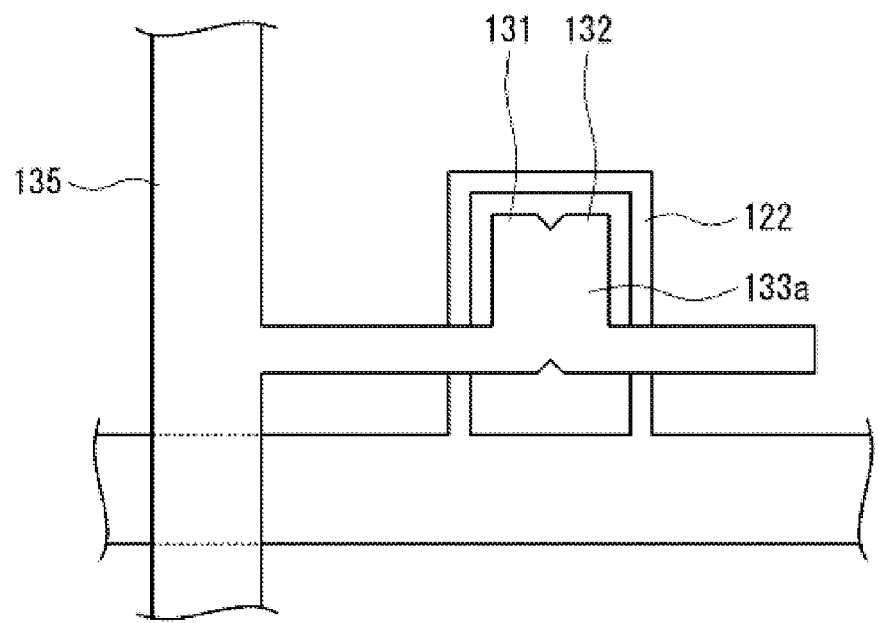
FIG. 12 are plan views showing the state following reflow of a conventional resist film.
Figure 12:
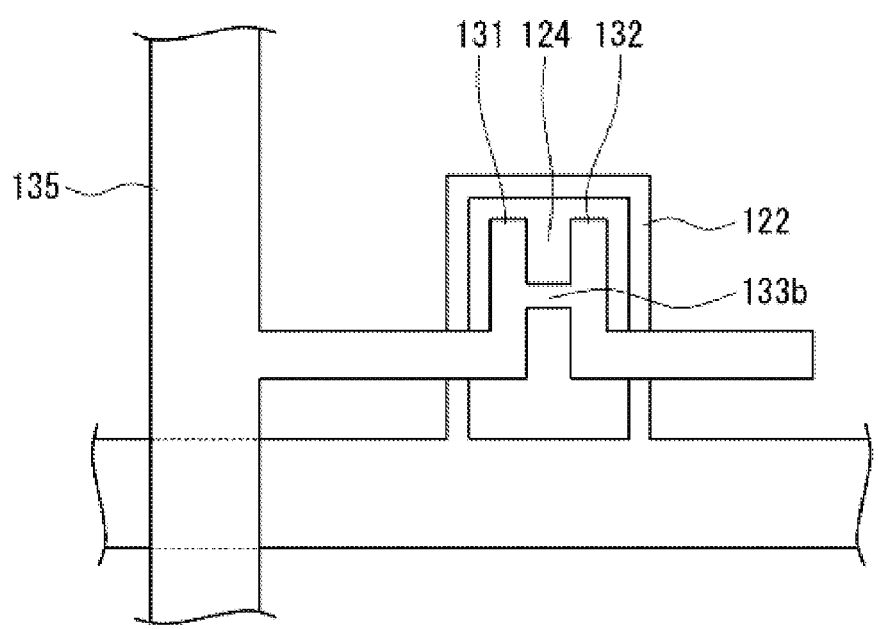

FIG. 9 is a sectional view showing a portion of the liquid crystal display panel of the liquid crystal display device of FIG. 7. As shown in FIG. 9, the liquid crystal display panel 2 is such that a pair of substrates, i.e., the aforementioned array substrate 10 of the present invention and an opposite substrate 70, are affixed with a gap therebetween and includes a liquid crystal layer 80 formed by sealing in a liquid crystal between the two substrates.

The array substrate 10 is an active matrix substrate as described above, and a single pixel includes, on the side of the liquid crystal layer 80 of the transparent substrate 11, one TFT 15 as the semiconductor element and a pixel electrode 17 connected to this TFT 15. Note that an alignment film 30 is provided on the liquid crystal side of the pixel electrode 17 of the array substrate 10. A rubbing film or the like of polyimide, for example, is used for the alignment film 30. The array substrate 10 is provided with a polarizing plate 51 on the side opposite from the liquid crystal layer 80 of the transparent substrate 11. A stretched film or the like formed by stretching in one direction a transparent film with iodine or dye being allowed to seep therein, for example, can be used for the polarizing plate 51.

The opposite substrate 70 is a color filter substrate including, on the side of the liquid crystal layer 80 of a transparent substrate 71 such as a glass plate, a color filter 72 that includes colored portions or the like capable of selectively transmitting light of the respective colors of red (R), green (G), and blue (B), an opposite electrode 73, an alignment film 74, and the like. Note that the opposite substrate 70 has a polarizing plate 75 disposed on the side opposite from the liquid crystal layer 80 of the transparent substrate 71.

The color filter 72 includes black matrices 72b arranged at the boundaries of the colored portions (72R, 72G, and 72B), and these black matrices 72b are provided in positions that cover non-pixel portions of the panel (regions where the TFTs or the like are formed). The opposite electrode 73 is composed of a transparent conductive film of ITO or the like and formed on the entire surface of the opposite substrate 70 on the side of the liquid crystal layer 80. Materials similar to those used for the array substrate 10 are used for the alignment film 74, polarizing plate 75, and the like.

The liquid crystal display panel 2 can be manufactured by individually manufacturing the aforementioned opposite substrate 70 and array substrate 10, affixing these together via a seal member (not shown) with the respective alignment film surfaces facing each other, injecting a liquid crystal between the two substrates to form the liquid crystal layer 80, and connecting drive circuits or the like. The liquid crystal display device 1 can be obtained by attaching the aforementioned backlight device 3, various types of control circuit, boards, and the like to the liquid crystal display panel 2. For example, control circuits that control the liquid crystal display panel 2 and array substrate 10, drive circuits, boards of power supply circuits or the like, circuits that control the backlight light source 3, and the like are used for the aforementioned control circuits and boards.

The display device of the present invention can be suitably utilized in large televisions or the like as a liquid crystal display device. The display device of the present invention is suitably used for a liquid crystal display device or the like but is not limited to a liquid crystal display device. Besides a liquid crystal display device, the display device of the present invention can be utilized for various types of display element as long as these are various types of flat panel display such as plasma display devices and organic EL display devices and also ones which use an array substrate driven in an active matrix scheme.

The invention claimed is:

1. An array substrate comprising:
    a substrate;
    a plurality of first wiring lines provided on said substrate substantially parallel to each other;
    a plurality of second wiring lines provided so as to be substantially orthogonal to said plurality of first wiring lines;
    an insulating layer interposed at the intersecting portions between said first wiring lines and said second wiring lines;
    switching elements respectively electrically connected to said first wiring lines and said second wiring lines and configured by laminating a plurality of thin films; and
    third wiring lines which are provided so as to be respectively continuous with said first wiring lines or said second wiring lines and which respectively connect said switching elements to said first wiring lines or said second wiring lines, wherein
    each of said switching elements is made in an island shape by etching that makes use of a reflowed resist film obtained by reflow of a resist film formed on said switching element, the corresponding one of said third wiring lines, and on the corresponding one of said first wiring lines or second wiring lines, and
    each of said third wiring lines is provided with a narrow portion in which the width is narrowed in planar shape.

2. The array substrate according to claim 1, wherein said first wiring lines are scan lines, said second wiring lines are signal lines, and said switching elements are thin-film transistors each comprising at least a gate electrode, a semiconductor layer, and a source/drain electrode.

3. The array substrate according to claim 2, wherein said third wiring lines are wiring lines that respectively connect said signal lines to the source/drain electrodes of said thin-film transistors.

4. A method for manufacturing an array substrate comprising:
    a substrate;
    a plurality of first wiring lines provided on said substrate substantially parallel to each other;
    a plurality of second wiring lines provided so as to be substantially orthogonal to said plurality of first wiring lines;
    an insulating layer interposed at the intersecting portions between said first wiring lines and said second wiring lines;
    a plurality of switching elements respectively electrically connected to said first wiring lines and said second wiring lines and configured by laminating a plurality of thin films; and
    third wiring lines which are provided so as to be respectively continuous with said first wiring lines or said second wiring lines and which respectively connect said switching elements to said first wiring lines or said second wiring lines, wherein
    the method comprises an etching step in which each of said switching elements is formed into an island shape that is continuous with the corresponding one of said first wiring lines or second wiring lines,
    said etching step comprises:
        a first etching step in which a resist film in a first pattern having two mutually facing regions is formed on a surface of a first layer to be etched on each of said switching elements, and the first etching is performed to form the first layer into the first pattern and also to expose a second layer to be etched around said first pattern;
        a reflow step in which the resist film in said first pattern is reflowed such that the resist film that is reflowed forms a reflowed resist film having an island-shaped second pattern that covers a specified region of the second layer to be etched; and
        a second etching step in which etching is performed from above said reflowed resist film to form said switching element in the island-shaped pattern by the etching of the second layer to be etched,
    said reflow step involves reflow of the resist film formed on said switching element, the corresponding one of said third wiring lines, and on the corresponding one of said first wiring lines or second wiring lines to form the reflowed resist film, and
    each of said third wiring lines is provided with a narrow portion in which the width is narrowed in planar shape, and the resist film in said first pattern is reflowed so as to cover the surface of said switching element.

5. The method for manufacturing an array substrate according to claim 4, wherein the planar shape of the resist film in said first pattern is two islands having a gap, and the planar shape of said reflowed resist film is one island in which the gap between said two islands is covered.

6. The method for manufacturing an array substrate according to claim 4, wherein said first wiring lines are scan lines, said second wiring lines are signal lines, and said switching elements are thin-film transistors each comprising at least a gate electrode, a semiconductor layer, and a source/drain electrode.

7. The method for manufacturing an array substrate according to claim 6, wherein said third wiring lines are wiring lines that respectively connect said signal lines to the source/drain electrodes of said thin-film transistors.

8. The method for manufacturing an array substrate according to claim 6, wherein said first pattern is a shape that covers at least the source/drain electrode of each thin-film transistor.

9. The method for manufacturing an array substrate according to claim 6, wherein said second pattern is a shape that covers at least the semiconductor layer portion of each thin-film transistor.

10. The method for manufacturing an array substrate according to claim 4, wherein said reflow step uses a chemical reflow method in which the resist film is softened using vapor of a solvent.

11. The method for manufacturing an array substrate according to claim 4, wherein the resist film in said first pattern is formed such that the thickness of the resist film on said first wiring line is smaller than the thickness of the resist film on said switching element.

12. The method for manufacturing an array substrate according to claim 11, wherein the resist film in said first pattern is formed to have a plurality of thicknesses using a multi-tone mask.

13. A display device comprising a display panel that uses the array substrate according to claim 1 as a switching substrate.

14. The display device according to claim 13, wherein the display panel is a liquid crystal display panel.

* * * * *